United States Patent
Okura

(10) Patent No.: US 11,609,260 B2
(45) Date of Patent: Mar. 21, 2023

(54) METHOD FOR INSPECTING INSULATION OF A SECONDARY BATTERY

(71) Applicant: PRIME PLANET ENERGY & SOLUTIONS, INC., Tokyo (JP)

(72) Inventor: Toshinori Okura, Toyota (JP)

(73) Assignee: Prime Planet Energy & Solutions, Inc., Tokyo (JP)

( * ) Notice: Subject to any disclaimer, the term of this patent is extended or adjusted under 35 U.S.C. 154(b) by 0 days.

(21) Appl. No.: 17/372,897

(22) Filed: Jul. 12, 2021

(65) Prior Publication Data

US 2022/0043047 A1  Feb. 10, 2022

(30) Foreign Application Priority Data

Aug. 7, 2020 (JP) .............................. JP2020-134939

(51) Int. Cl.
| | | |
|---|---|---|
| *G01R 31/00* | (2006.01) | |
| *G01R 31/14* | (2006.01) | |
| *H01M 10/0525* | (2010.01) | |
| *H01M 10/42* | (2006.01) | |
| *H01M 10/44* | (2006.01) | |
| *H01M 10/48* | (2006.01) | |
| *H02J 7/00* | (2006.01) | |

(52) U.S. Cl.
CPC ........ *G01R 31/14* (2013.01); *H01M 10/0525* (2013.01); *H01M 10/4285* (2013.01); *H01M 10/446* (2013.01); *H01M 10/48* (2013.01); *H01M 2220/20* (2013.01); *H02J 7/0047* (2013.01)

(58) Field of Classification Search
USPC .................... 324/426, 430–435, 551, 557
See application file for complete search history.

(56) References Cited

U.S. PATENT DOCUMENTS

| | | | |
|---|---|---|---|
| 5,650,710 A * | 7/1997 | Hotta ...................... | B60L 58/15 320/155 |
| 2019/0011502 A1 | 1/2019 | Kobayashi et al. | |
| 2019/0011504 A1* | 1/2019 | Kim ....................... | G01R 27/14 |
| 2019/0198942 A1 | 6/2019 | Kobayashi et al. | |

FOREIGN PATENT DOCUMENTS

| | | |
|---|---|---|
| JP | 2014-134395 A | 7/2014 |
| JP | 2019-016558 A | 1/2019 |
| JP | 2019-113450 A | 7/2019 |

\* cited by examiner

*Primary Examiner* — Vincent Q Nguyen
(74) *Attorney, Agent, or Firm* — Finnegan, Henderson, Farabow, Garrett & Dunner, LLP

(57) ABSTRACT

In a method for inspecting the insulation property of a secondary battery by connecting an external DC power supply to the secondary battery charged with an initial charge amount and evaluating the insulation property of the secondary battery based on a converging state of a power-supply current, when a charge amount at which an inclination of a tangent to a charge amount—battery voltage curve representing a relationship between the charge amount and a battery voltage of the secondary battery is smallest is assumed as a minimum-inclination charge amount, and the inclination of the tangent at the minimum-inclination charge amount is assumed as a minimum inclination ($\alpha L$), the initial charge amount is selected from a range of the charge amount in which the inclination is two or more times the minimum inclination.

5 Claims, 5 Drawing Sheets

METHOD FOR INSPECTING INSULATION OF A SECONDARY BATTERY

CROSS-REFERENCE TO RELATED APPLICATIONS

This application is based upon and claims the benefit of priority to Japanese Patent Application No. 2020-134939 filed on Aug. 7, 2020, the entire contents of which are incorporated herein by reference.

BACKGROUND

Technical Field

The present disclosure relates to an insulation inspection method for a secondary battery to evaluate the internal electrical insulation property of the secondary battery.

Related Art

In manufacturing of a secondary battery such as a lithium ion secondary battery (hereinafter, simply referred to as a "battery"), minute metal foreign substances, such as iron or copper foreign substances, may intrude into an electrode body. Some intruded metal foreign substances may cause a minute internal short circuit in the battery. To avoid such defects, the internal insulation property of the battery may be inspected.

As such a method for inspecting the insulation property, the following techniques have been known. Specifically, a battery that has been charged in advance is connected to an external DC power supply to constitute an inspection circuit and then is continuously applied with an output voltage Vb from the external DC power supply in which the output voltage Vb is equal to a pre-inspection battery voltage V0 (Vb=V0) of the battery obtained just before the inspection. After a current value Ib(t) of a power supply current I passing through this inspection circuit converges to a substantially constant value, a convergence current value Ibs is detected. When the detected convergence current value Ibs is greater than a predetermined reference current value Ibk (Ibs>Ibk), the battery is determined to be a defective product having a low insulation property (i.e., in which a minute internal short circuit has occurred). A conventional art related to the foregoing method for inspecting the insulation property of a battery may include for example the techniques disclosed in Japanese patent unexamined application publications Nos. 2019-016558 and 2019-113450.

SUMMARY

Technical Problems

However, in the above-described insulation inspection method, it takes much time until the current value Ib(t) of the power supply current I passing through the inspection circuit substantially converges. This would cause a problem that the inspection needs long time.

The present disclosure has been made to address the above problems and has a purpose to provide an insulation inspection method for inspecting the insulation property of a secondary battery with a reduced inspection time.

Means of Solving the Problems

To achieve the above-mentioned purpose, one aspect of the present disclosure provides a method for inspecting an insulation property of a secondary battery, the method including: connecting an external DC power supply to the secondary battery charged with a predetermined initial charge amount to constitute an inspection circuit; and evaluating the insulation property of the secondary battery based on a converging state of a power-supply current passing through the inspection circuit, wherein when a charge amount at which an inclination of a tangent to a charge amount—battery voltage curve representing a relationship between the charge amount and a battery voltage of the secondary battery is smallest is assumed as a minimum-inclination charge amount, and the inclination of the tangent at the minimum-inclination charge amount is assumed as a minimum inclination, the initial charge amount is selected from a range of the charge amount in which the inclination is two or more times the minimum inclination.

In the above-described insulation inspection method, the initial charge amount for the insulation inspection is selected from the range of the charge amount, in which the inclination is two or more times the minimum inclination. Therefore, considering a local battery capacitance of the battery (a local battery capacitance), which is the inverse of the inclination, the local battery capacitance during the insulation inspection (the initial charge amount) is merely ½ or less in comparison with the local battery capacitance for the minimum-inclination charge amount. When the local battery capacitance is small, during the insulation inspection, the battery voltage is greatly decreased and further the power-supply current is greatly increased with a slight decrease in the charge amount. Thus, as compared with the insulation inspection to be performed with the initial charge amount set as the minimum-inclination charge amount, the convergence time until the power-supply current converges can be greatly shortened and hence the inspection time can be significantly reduced.

In the insulation inspection method of the secondary battery, described above, the initial charge amount may be selected from a range of the charge amount in which the inclination is three or more times the minimum inclination.

In the above-described insulation inspection method, the initial charge amount is selected from the charge amount range in which the inclination is three or more times the minimum inclination. Thus, the local battery capacitance during the insulation inspection is further smaller than when the initial charge amount is selected from the charge amount range in which the inclination is two or more times the minimum inclination. The convergence time the power-supply current converges can be further shortened and hence the inspection time can be further reduced.

Furthermore, in any insulation inspection method of the secondary battery described above, the initial charge amount may be selected from a range of the charge amount that is larger than the minimum-inclination charge amount.

It has been seen that, when the initial charge amount is smaller than the minimum-inclination charge amount, the power-supply current passing through the inspection circuit more greatly varies with a slight variation in the cell temperature than when the initial charge amount is larger than the minimum-inclination charge amount. In contrast, in the above-described insulation inspection method, the initial charge amount is selected from the charge amount range in which the inclination is two or more times the minimum inclination or alternatively the inclination is three or more times the minimum inclination and further the charge amount is larger than the minimum-inclination charge amount. This configuration can prevent the power-supply current from greatly varying with a slight variation in the battery temperature while reducing the inspection time.

DETAILED DESCRIPTION OF THE EXEMPLARY EMBODIMENTS

Figure 1:
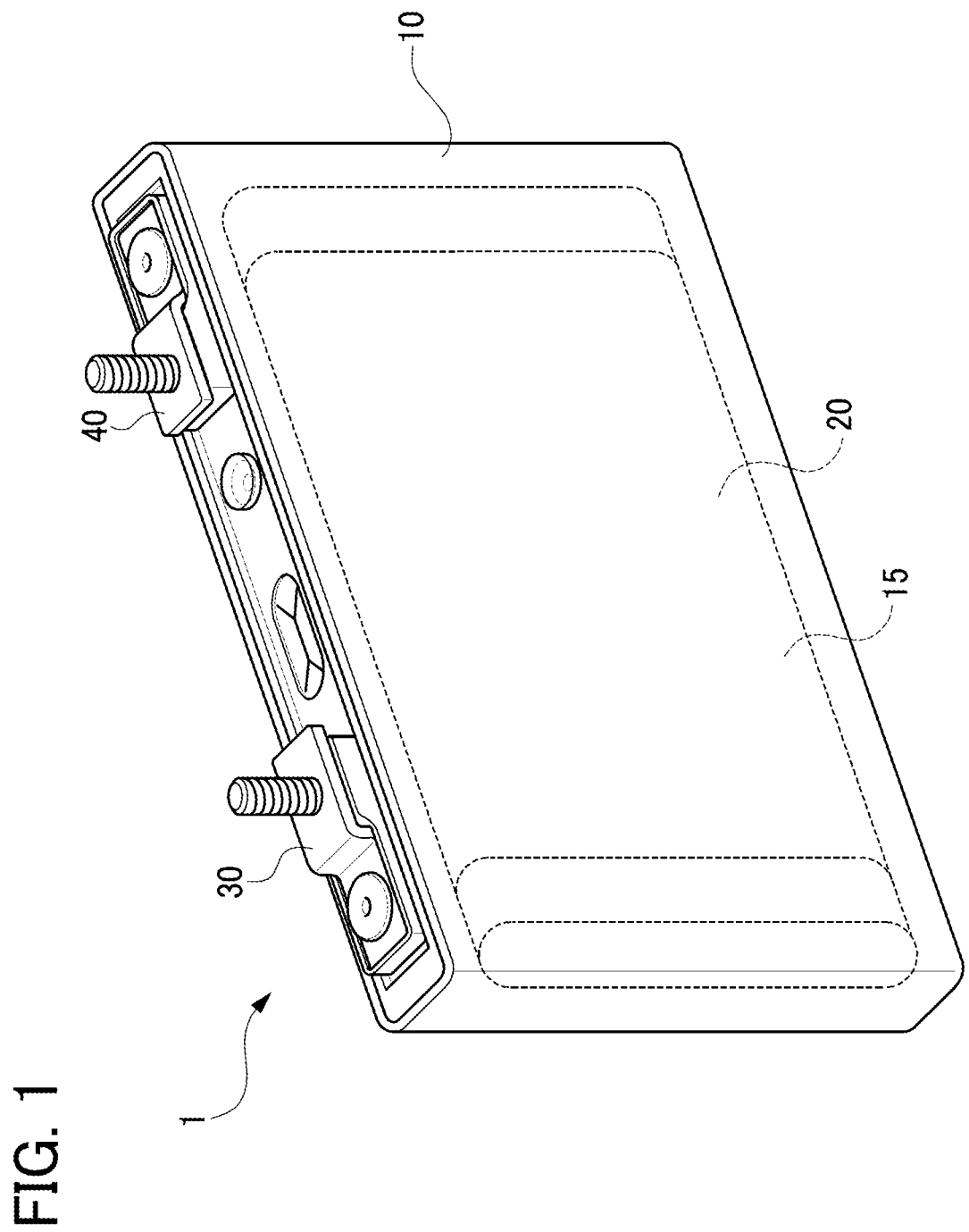
FIG. 1 is a perspective view of a battery in an embodiment.
Figure 2:
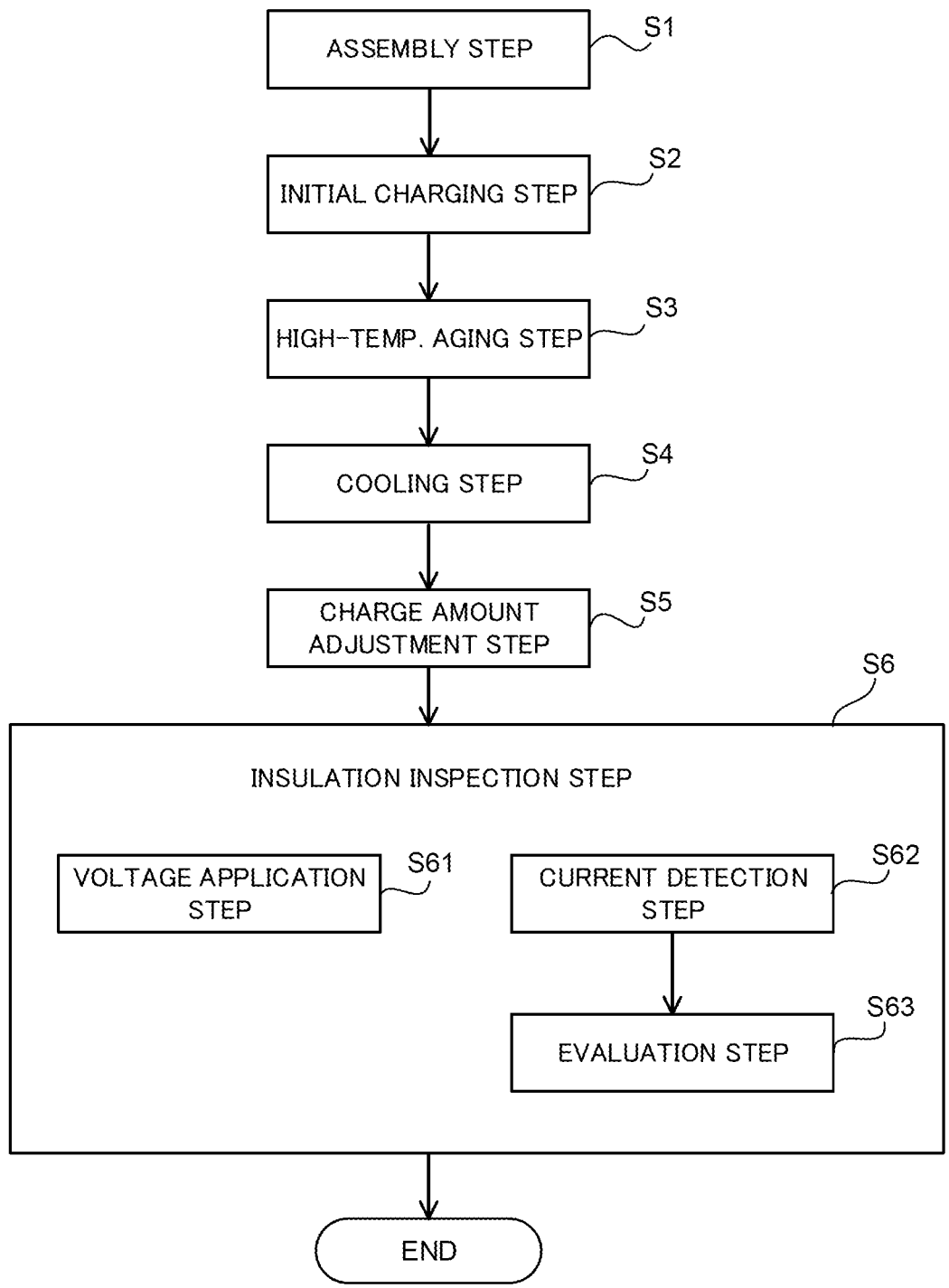
FIG. 2 is a flowchart of a battery manufacturing method including an insulation inspection method in the embodiment.

A detailed description of an embodiment of this disclosure will now be given referring to the accompanying drawings. FIG. 1 shows a perspective view of a secondary battery in the present embodiment (hereinafter, also simply referred to as a "battery 1"). This battery 1 includes a battery case 10 having a rectangular parallelepiped box shape, an electrode body 20 having a flat wound shape and an electrolyte solution 15 both of which are accommodated in the battery case 10, a positive terminal member 30 and a negative terminal member 40, and others. In the present embodiment, lithium transition metal complex oxide, specifically, lithium nickel cobalt manganese-based complex oxide, is used as the positive electrode active material, and a carbon material, specifically, graphite, is used as the negative electrode active material.

A method for manufacturing the battery 1 including the insulation inspection method to evaluate the internal insulation property of the battery 1 will be described below (see FIGS. 2 to 5). In an assembly step S1 (see FIG. 2), firstly, a non-charged battery 1 (see FIG. 1) is assembled.

In an initial charging step S2 (see FIG. 2), subsequently, the assembled battery 1 is charged for the first time. Specifically, the battery 1 is restrained in a compressed state in the thickness direction thereof with a restraining jig (not shown). The battery 1 in such a restrained state is subjected to the initial charging step S2 to an insulation inspection step S6 described below.

Thereafter, the battery 1 is connected to a charging and discharging device (not shown) and charged for initial charge to 90% SOC by constant current constant voltage (CCCV) at an ambient temperature of 20° C. In the present embodiment, the state of the battery 1 having been charged with a maximum charge amount QF is assumed as 100% SOC. If the battery 1 is charged to 100% SOC for the initial charge, Li-deposition is likely to occur during the initial charge and further the positive electrode active material is apt to deteriorate in a subsequent high-temperature aging step S3. For the initial charge, therefore, the battery 1 is preferably charged to about 90% SOC or less.

In the high-temperature aging step S3 (see FIG. 2), the initially charged battery 1 is subjected to high-temperature aging by leaving this battery 1 stand for 6 hours at an ambient temperature of 63° C. while both terminals are left open. In this high-temperature aging, the battery voltage V of the battery 1 decreases to a battery voltage corresponding to about 80% SOC. In a cooling step S4 (see FIG. 2), successively, the battery 1 is left stand at an ambient temperature of 20° C. and cooled to a battery temperature of 20° C.

In a charge amount adjustment step S5 (see FIG. 2), the battery 1 is charged with a constant current constant voltage (CCCV) at an ambient temperature of 20° C. to adjust the charge amount Q of the charged battery 1 to a predetermined initial charge amount Q0.

Figure 3:
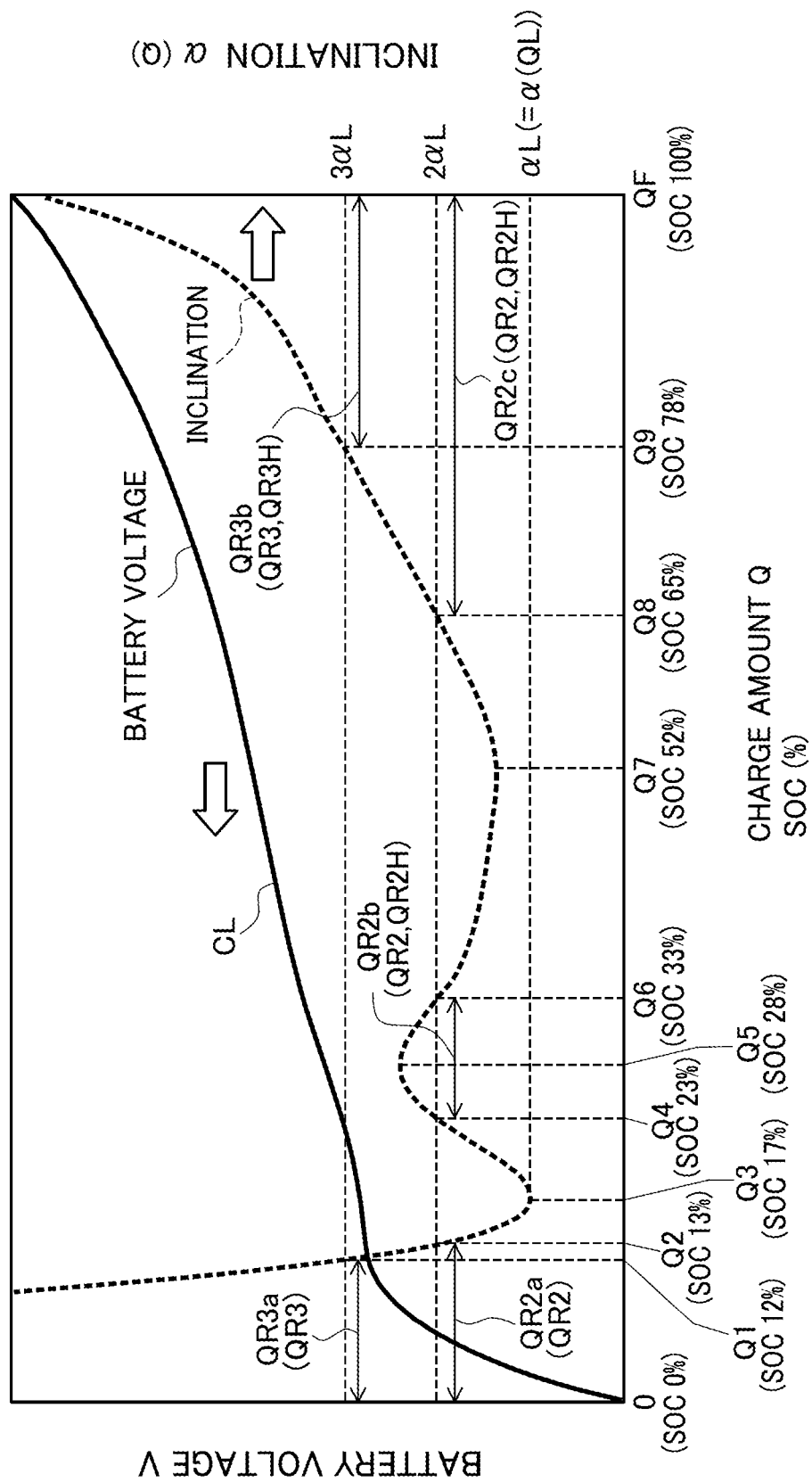
FIG. 3 is a graph showing a relationship among a charge amount stored in a battery, a battery voltage, and an inclination of a tangent to a charge amount—battery voltage curve in the embodiment.

Herein, a method for determining this initial charge amount Q0 will be described below. When the battery 1 is considered as a condenser, the battery voltage V, the battery capacitance C, and the charge amount Q stored in the battery 1 should have a relationship: V=Q/C, in which the battery voltage V is proportional to the charge amount Q. However, in practice, the battery voltage V is not proportional to the charge amount Q as seen by the charge amount—battery voltage curve CL plotted with a solid line in FIG. 3. Specifically, as indicated by a broken line in FIG. 3, the inclination $\alpha(Q)$ of a tangent to the charge amount—battery voltage curve CL, in which $\alpha(Q)=\Delta V/\Delta Q$, varies depending on the magnitude of the charge amount Q. The graph of the inclination $\alpha(Q)$ shown in FIG. 3 is obtained by calculation of the inclination $\alpha(Q)=\Delta V/\Delta Q$ based on the charge amount Q and the battery voltage V each obtained per 1% SOC.

The following considers a local battery capacitance Cp(Q) (Cp(Q)=$\Delta Q/\Delta V$), which is a local battery capacitance according to the magnitude of the charge amount Q. This local battery capacitance Cp(Q) is the inverse of the inclination $\alpha(Q)$, that is, Cp(Q)=$1/\alpha(Q)$. Thus, it can be seen that the local battery capacitance Cp(Q) also varies depending on the magnitude of the charge amount Q.

Accordingly, when an insulation inspection step S6 which will be described later is performed with the initial charge amount Q0 at which the local battery capacitance Cp(Q) is smaller (i.e., the inclination $\alpha(Q)$ which is the inverse is larger), the battery voltage V more greatly decreases by a slight decrease in the charge amount Q and further the power-supply current I passing through an inspection circuit 100 (see FIG. 4) which will be described later more greatly increases. Thus, the convergence time is required for the power-supply current I to converge can be shortened, resulting in a reduced inspection time. In a charge amount adjustment step S5 prior to step S6, therefore, the initial charge amount Q0 is selected from an initial charge amount Q0 at which the local battery capacitance Cp(Q) is small and hence the inclination $\alpha(Q)$ is large.

Specifically, a charge amount Q (a minimum-inclination charge amount QL) at which the inclination $\alpha(Q)$ of a tangent to the charge amount—battery voltage curve CL is smallest and an inclination $\alpha(QL)$ (=$\alpha L$) of the tangent at this minimum-inclination charge amount QL are first found out. In the battery 1 of the present embodiment, as shown in FIG. 3, the inclination $\alpha(Q)$ is plotted in a W-shaped curve, in which the inclination $\alpha(Q)$ in a range of a charge amount 0 to a charge amount Q3 (0% to 17% SOC) is smaller as the charge amount Q is larger, the inclination $\alpha(Q)$ in a range of the charge amount Q3 to a charge amount Q5 (17% to 28% SOC) is larger as the charge amount Q is larger, the inclination $\alpha(Q)$ in a range of the charge amount Q5 to a charge amount Q7 (28% to 52% SOC) is smaller as the charge amount Q is larger, and the inclination $\alpha(Q)$ in a range of the charge amount Q7 to a charge amount QF (52% to 100% SOC) is larger as the charge amount Q is larger. In this battery 1, furthermore, the inclination α(Q) is smallest at the charge amount Q3 (17% SOC) and thus the minimum-inclination charge amount QL corresponds to Q3 (QL=Q3).

Next, the initial charge amount Q0 is selected from the range QR2 of the charge amount Q, in which the inclination α(Q) is two or more times the minimum inclination αL, i.e., α(Q)≥2αL. In the present embodiment, as shown in FIG. 3, this range QR2 of the charge amount Q includes three ranges QR2*a*, QR2*b*, and QR2*c*. Specifically, the range QR2*a* is expressed as 0≤Q≤Q2 (0% to 13% SOC), the range QR2*b* is expressed as Q4≤Q≤Q6 (23% to 33% SOC), and the range QR2*c* is expressed as Q8≤Q≤QF (65% to 100% SOC). When the initial charge amount Q0 is selected from the range QR2, the local battery capacitance Cp(Q0) in the insulation inspection step S6 can be reduced to ½ or less of the local battery capacitance Cp(Q) for the minimum-inclination charge amount QL. Accordingly, in the insulation inspection step S6, the convergence time ts until the power-supply current I converges can be greatly shortened to ½ or less and hence the inspection time can be greatly reduced as compared to the case where the minimum-inclination charge amount QL is set to the initial charge amount Q0 (Q0=QL).

In the present embodiment, furthermore, the initial charge amount Q0 may be selected from the range QR3 of the charge amount Q, in which the inclination α(Q) is three or more times the minimum inclination αL, i.e., α(Q)≥3αL. As shown in FIG. 3, this range QR3 of the charge amount Q includes two ranges QR3*a* and QR3*b*. Specifically, the range QR3*a* is expressed as 0≤Q≤Q1 (0% to 12% SOC) and the range QR3*b* is expressed as Q9≤Q≤QF (78% to 100% SOC). When the initial charge amount Q0 is selected from this range QR3, the local battery capacitance Cp(Q0) in the insulation inspection step S6 can be reduced to ⅓ or less of the local battery capacitance Cp(QL) for the minimum-inclination charge amount QL. Thus, the convergence time ts until the power-supply current I converges can be further shortened and hence the inspection time also can be further reduced.

The initial charge amount Q0 also may be selected from a range QR2H (QR2*b* and QR2*c*) of the charge amount Q that is larger than the minimum-inclination charge amount QL within the foregoing range QR2 of the charge amount Q, specifically, from the ranges expressed as Q4≤Q≤Q6 (23% to 33% SOC) and Q8≤Q≤QF (65% to 100% SOC). Furthermore, the initial charge amount Q0 also may be selected from a range QR3H (QR3*b*) of the charge amount Q that is larger than the minimum-inclination charge amount QL within the foregoing range QR3 of the charge amount Q, specifically, from the range expressed as Q9≤Q≤QF (78% to 100% SOC). This configuration can prevent the power-supply current I from greatly varying with a slight variation in the battery temperature in the insulation inspection step S6.

In the present embodiment, the initial charge amount Q0 may be selected from the range QR3H (QR3*b*) of the charge amount Q, concretely, from the range expressed as Q9≤Q≤QF (78% to 100% SOC) so that all the above-described conditions are satisfied. In the present embodiment, concretely, the battery 1 is adjusted to 90% SOC in the charge amount adjustment step S5.

Next, the insulation inspection step S6 (see FIG. 2) is performed. This insulation inspection step S6 is carried out at an ambient temperature of 20° C. The insulation inspection step S6 includes a voltage application step S61, a current detection step S62, and an evaluation step S63. In the voltage application step S61, firstly, the battery 1 is continuously applied with an output voltage Vb equal to a pre-inspection battery voltage V0 (Vb=V0) from the external DC power supply EP to allow the power-supply current I to continuously flow from the external DC power supply EP to the battery 1 (see FIG. 4). In other words, the external DC power supply EP is connected to the battery 1 to constitute the inspection circuit 100. Specifically, a pair of probes P1 and P2 of the external DC power supply EP are respectively placed in contact with the positive terminal member 30 and the negative terminal member 40 of the battery 1.

Figure 4:
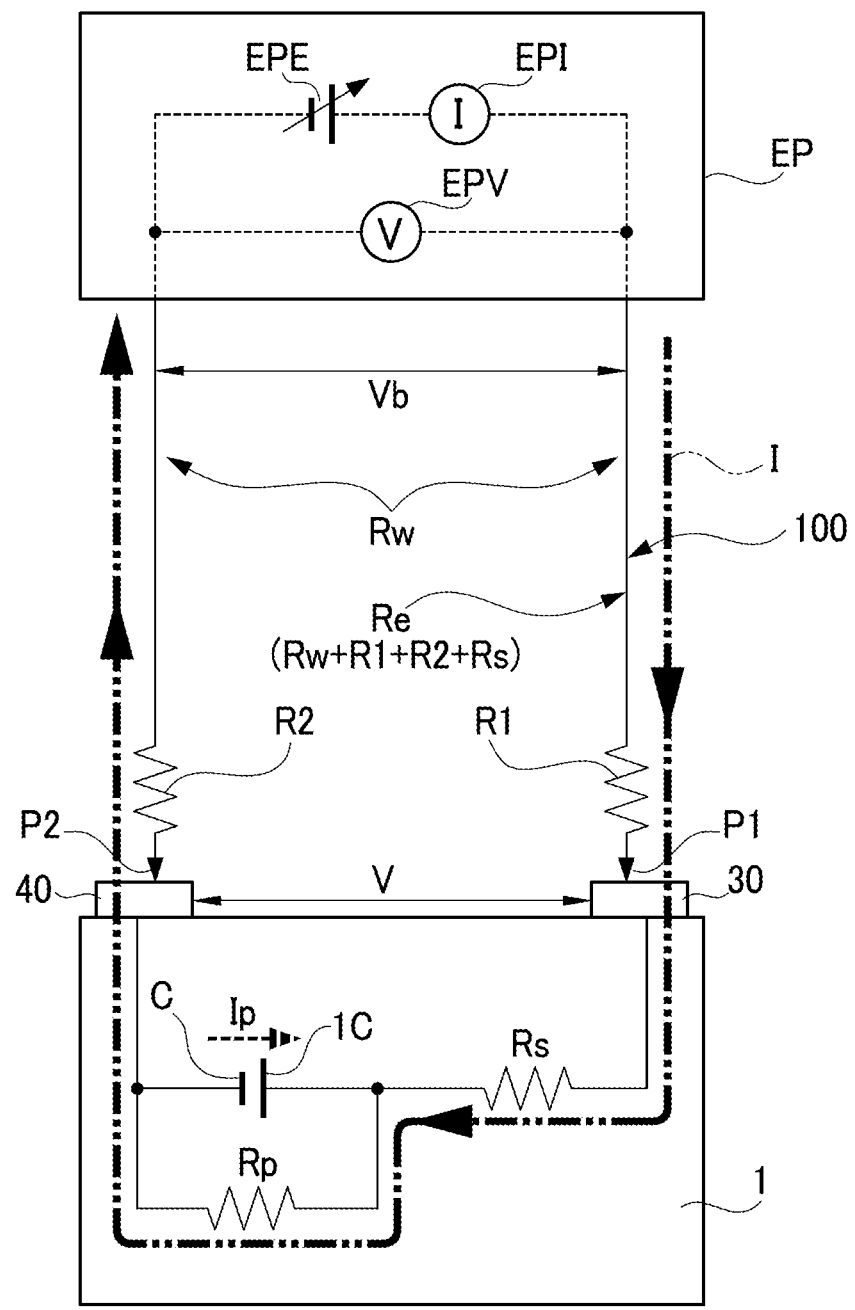
FIG. 4 is a circuit diagram of an inspection circuit configured with a battery and an external DC power supply connected thereto.

In the present embodiment, an equivalent circuit to the inspection circuit 100 may be provided as an equivalent circuit shown in FIG. 4. An equivalent circuit of the battery 1 may be configured such that a battery resistance Rs is connected in series to a parallel circuit made up of a battery capacitance C and a self-discharge resistance Rp of the battery 1. To those circuits, the output voltage Vb of the external DC power supply EP is applied. The battery capacitance C is a battery capacity of the battery 1 (a battery component 1C). The self-discharge resistance Rp is a resistance generated mainly by an internal short circuit of the battery 1. The battery resistance Rs is a DC resistance of the battery 1. In the inspection circuit 100, a wiring resistance Rw is a wiring resistance distributed inside the external DC power supply EP and from the external DC power supply EP to the probes P1 and P2. A contact resistance R1 is a contact resistance between one probe P1 of the external DC power supply EP and the positive terminal member 30 of the battery 1. A contact resistance R2 is a contact resistance between the other probe P2 of the external DC power supply EP and the negative terminal member 40 of the battery 1. The sum of the wiring resistance Rw, the contact resistances R1 and R2, and the battery resistance Rs is provided as a series circuit resistance Re of the inspection circuit 100, i.e., Re=Rw+R1+R2+Rs.

The power-supply current I is a current flowing from the external DC power supply EP to the battery 1 and the self-discharge current Ip is a self-discharge current flowing through the inside of the battery 1 (the battery component 1C) in association with self-discharge. The external DC power supply EP can change and accurately control the output voltage Vb generated by its own DC power supply EPE. In addition, the external DC power supply EP includes a voltmeter EPV that can measure a battery voltage V (V). The external DC power supply EP also includes an ammeter EPI that can measure, with high accuracy, a current value Ib (μA) of the power-supply current I flowing from the external DC power supply EP (the DC power supply EPE) to the battery 1.

In the voltage application step S61, under a condition that the current value Ib is 0, the battery voltage V of the battery 1 (i.e., the pre-inspection battery voltage V0) is detected by the voltmeter EPV contained in the external DC power supply EP. Then, application of the output voltage Vb equal to this pre-inspection battery voltage V0 (Vb=V0) to the battery 1 is started.

After the start of application of the output voltage Vb (after an application duration time t=0), the current detection step S62 is performed in parallel with the voltage application step S61. Specifically, the current value Ib (t) of the power-supply current I passing through the inspection circuit 100 is detected. In the present embodiment, the current value Ib (t) is detected by the ammeter EPI contained in the external DC power supply EP every time the application duration time t passes 1 second.

Figure 5:
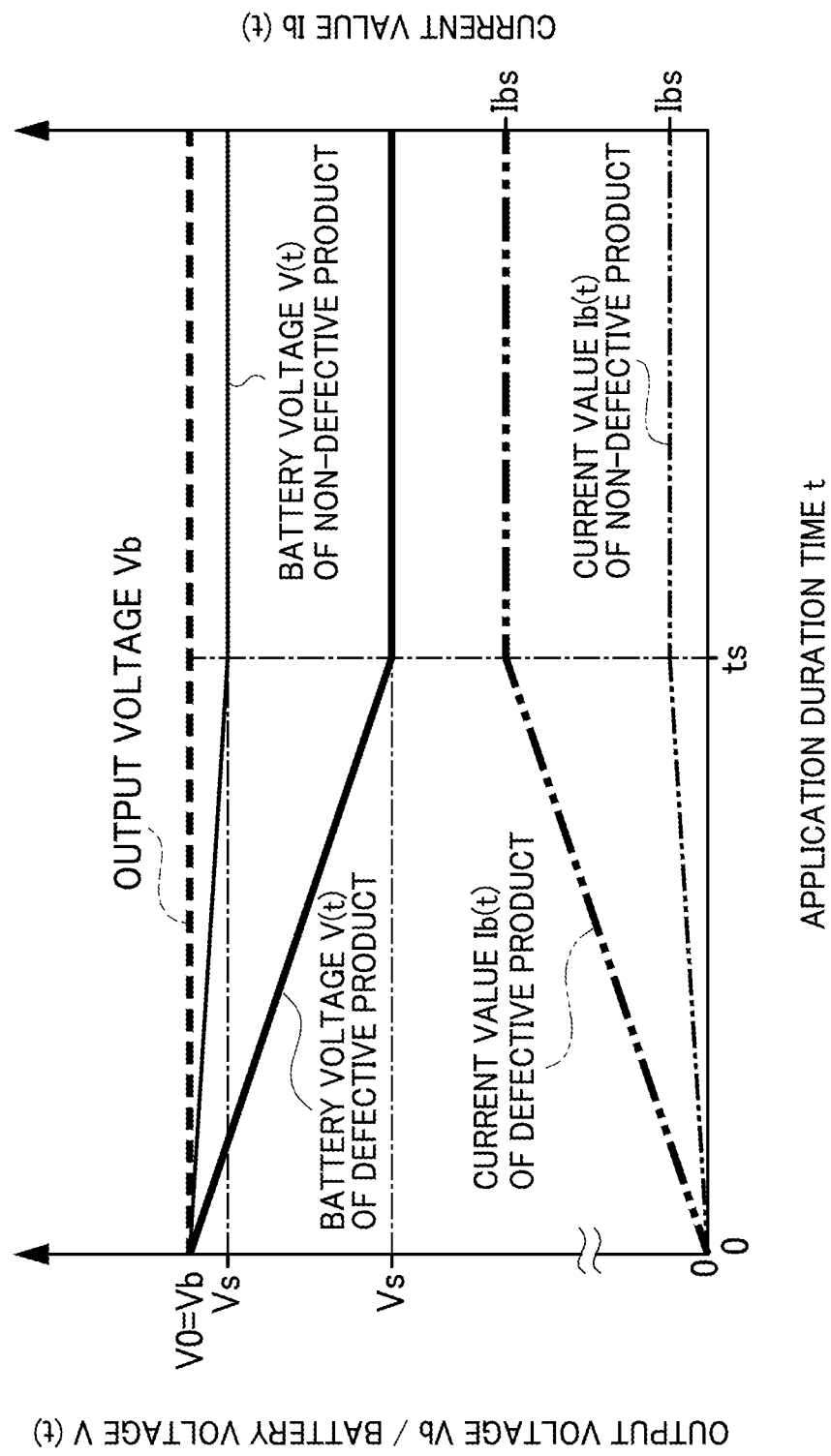
FIG. 5 is a graph schematically showing a relationship, in non-defective and defective batteries, among an application duration time of output voltage, an output voltage, a battery voltage, and a current value of power-supply current.

Herein, for each of batteries 1 provided as a non-defective product and a defective product, FIG. 5 schematically shows a relationship among the application duration time t of an output voltage Vb by the external DC power supply EP, the output voltage Vb, the battery voltage V(t), and the current value Ib(t) of a power-supply current I. As shown in FIG. 5, the battery voltage V(t) of each battery gradually decreases as the application duration time t elapses from the pre-inspection battery voltage V0. Further, from when the application duration time t reaches the convergence time ts (t=ts), the battery voltage V(t) continues at a substantially constant value (the convergence battery voltage Vs). However, the battery voltage V(t) of the defective battery 1 greatly decreases as compared with that of the non-defective battery 1, so that the convergence battery voltage Vs of the defective battery 1 also becomes a lower value than that of the non-defective battery 1.

In contrast, the current value Ib(t) of each battery gradually increases as the application duration time t passes from 0 (zero). Further, from when the application duration time t reaches the convergence time ts, the battery voltage V(t) continues at a substantially constant value (the convergence current value Ibs). However, the current value Ib(t) of the defective battery 1 greatly increases as compared with that of the non-defective battery 1, so that the convergence current value Ibs of the defective battery 1 also becomes a larger value than that of the non-defective battery 1.

In the present embodiment, the initial charge amount Q0 is selected from the range QR2 (QR2*a*, QR2*b*, and QR2*c*) of the charge amount Q that satisfies the condition: $\alpha(Q) \geq 2\alpha L$, as described above. Further, the initial charge amount Q0 may be selected from the range QR3 (QR3*a* and QR3*b*) of the charge amount Q that satisfies the condition: $\alpha(Q) \geq 3\alpha L$. In the present embodiment, concretely, the initial charge amount Q0 corresponding to 90% SOC is selected. Thus, the convergence time ts can be significantly shortened more than when the initial charge amount Q0 is set to QL (Q0=QL). Thus, even though detailed experimental results are omitted, the convergence time ts can be shortened to ½ or less, further to ⅓ or less, specifically to about ¼ than that when the initial charge amount Q0 is set to QL. Accordingly, it is possible to significantly reduce the inspection time required for the insulation inspection step S6, i.e., the current detection step S62.

In the present embodiment, additionally, the initial charge amount Q0 (corresponding to 90% SOC) is selected from the range QR2H of the charge amount Q that is larger than the minimum-inclination charge amount QL within the range QR2 of the charge amount Q. Furthermore, the initial charge amount Q0 may be selected from the range QR3H of the charge amount Q that is larger than the minimum-inclination charge amount QL within the range QR3 of the charge amount Q. Thus, in the insulation inspection step S6 (the current detection step S62), it is possible to prevent the power-supply current I from greatly varying with a slight variation in the battery temperature.

When this current detection step S62 is terminated, the voltage application from the external DC power supply EP to the battery 1 is stopped so that the voltage application step S61 is also terminated. Thereafter, the external DC power supply EP is disconnected from the battery 1 and further the battery 1 is released from the compressed state by the retraining jig (not shown).

In an evaluation step S63, additionally, the internal insulation property of the battery 1 is evaluated based on a converging state of the power-supply current I passing through the inspection circuit 100, that is, based on the magnitude of the convergence current value Ibs detected in the current detection step S62. In the present embodiment, when the convergence current value Ibs is larger than the reference current value Ibk (Ibs>Ibk), the battery 1 is determined to be defective with a low insulation property, in which an internal short circuit has occurred. This battery 1 is thus discarded. In contrast, when the convergence current value Ibs is equal to or less than the reference current value Ibk (Ibs≤Ibk), the battery 1 is determined to be non-defective with a high insulation property. This non-defective battery 1 then undergoes other inspections or the like. Thus, the battery 1 is completed.

The present disclosure is described in the foregoing embodiments, but is not limited thereto. The present disclosure may be embodied in other specific forms without departing from the essential characteristics thereof.

For instance, in the foregoing embodiments, the insulation inspection of the battery 1 is performed in the manufacturing process of the battery 1, but not limited thereto. The insulation inspection of the battery 1 may be performed on a spent battery 1 after mounted on an automobile or the like or after put alone on the market.

Further, in the voltage application step S61 in the foregoing embodiment, the output voltage Vb applied from the external DC power supply EP to the battery 1 is constant (Vb=V0) regardless of the elapse of the application duration time t, but is not limited thereto. For instance, as described in JP 2019-113450A, an alternative method may be configured such that the output voltage Vb at the start of voltage application (the application duration time t=0) is set to be as large as the pre-inspection battery voltage V0 of the battery 1, that is, Vb=V0, while the output voltage Vb after the start of application is increased gradually or stepwise.

REFERENCE SIGNS LIST

1 Secondary battery (Battery)
100 Inspection circuit
S5 Charge amount adjustment step
S6 Insulation inspection step
Q Charge amount (stored in a battery)
Q0 Initial charge amount
QL Minimum-inclination charge amount
QR2 Range (of a charge amount in which an inclination is two or more times a minimum inclination)
QR2H Range (of a charge amount larger than the minimum-inclination charge amount within a charge amount range QR2)
QR3 Range (of a charge amount in which an inclination is three or more times a minimum inclination)
QR3H Range (of a charge amount larger than the minimum-inclination charge amount within a charge amount range QR3)
C Battery capacitance
Cp(Q) Local battery capacitance
CL Charge amount—battery voltage curve
$\alpha(Q)$ Inclination (of a tangent)
$\alpha L$ Inclination
I Power-supply current
Ib(t) Current value
EP Battery voltage

What is claimed is:
1. A method for inspecting an internal insulation property of a secondary battery, the method including:
connecting an external DC power supply to the secondary battery to constitute an inspection circuit; and
evaluating the internal insulation property of the secondary battery charged with a predetermined initial charge amount based on a power-supply current passing through the inspection circuit,
wherein
   a rate of change of the charge amount with the battery voltage is denoted as an inclination of a curve representing a relationship between the charge amount and the battery voltage,
   a charge amount at which the inclination has a minimum value is denoted as a minimum-inclination charge amount,
   the minimum value is denoted as a minimum inclination, and
   the predetermined initial charge amount is selected from a range of charge amounts for which the inclination is two or more times the minimum inclination.

2. The method for inspecting the internal insulation property of a secondary battery according claim 1, wherein the predetermined initial charge amount is selected from a range of the charge amounts for which the inclination is three or more times the minimum inclination.

3. The method for inspecting the internal insulation property of a secondary battery according claim 2, wherein the predetermined initial charge amount is selected from a range of the charge amounts larger than the minimum-inclination charge amount.

4. The method for inspecting the internal insulation property of a secondary battery according claim 1, wherein the predetermined initial charge amount is selected from a range of the charge amounts larger than the minimum-inclination charge amount.

5. The method for inspecting the internal insulation property of a secondary battery according to claim 1, wherein
   a positive terminal of the external DC power supply is connected to a positive terminal of the secondary battery, and
   a negative terminal of the external DC power supply is connected to a negative terminal of the secondary battery.

\* \* \* \* \*